(12) United States Patent
Chi (10) Patent No.: US 9,768,325 B2
(45) Date of Patent: Sep. 19, 2017

(54) DIODES AND FABRICATION METHODS THEREOF

(71) Applicant: GLOBALFOUNDRIES Inc., Grand Cayman (KY)

(72) Inventor: Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 62 days.

(21) Appl. No.: 14/730,294

(22) Filed: Jun. 4, 2015

(65) Prior Publication Data
US 2016/0359056 A1 Dec. 8, 2016

(51) Int. Cl.
| H01L 29/866 | (2006.01) |
| H01L 21/306 | (2006.01) |
| H01L 29/66  | (2006.01) |
| H01L 29/06  | (2006.01) |
| H01L 29/165 | (2006.01) |

(52) U.S. Cl.
CPC .......... *H01L 29/866* (2013.01); *H01L 21/306* (2013.01); *H01L 29/0684* (2013.01); *H01L 29/0688* (2013.01); *H01L 29/165* (2013.01); *H01L 29/66106* (2013.01)

(58) Field of Classification Search
CPC ........... H01L 21/30608; H01L 29/7848; H01L 29/66636; H01L 29/165; H01L 29/66628
See application file for complete search history.

(56) References Cited

U.S. PATENT DOCUMENTS

2011/0104875 A1* 5/2011 Wojtczak .......... H01L 21/30608
438/478

OTHER PUBLICATIONS

J.Teichmann, et.al., "One time programming (OTP) with Zener diodes in CMOS", processes, ESSERC, p. 433, 2003.
L. Luh, J. Choma, Jr., J. Draper, "A Zener-Diode-Activiated ESD Protection Circuit for Sub-Micron CMOS Processes", IEEE International Symposium on Circuits and Systems, p. v-65, 2000.
(Continued)

*Primary Examiner* — Fernando L Toledo
*Assistant Examiner* — Lawrence-Linh T Nguyen
(74) *Attorney, Agent, or Firm* — Heslin Rothenberg Farley & Mesiti P.C.; Nathan B. Davis (57) ABSTRACT

Diodes and fabrication methods thereof are presented. The diodes include, for instance: a first semiconductor region disposed at least partially within a substrate, the first semiconductor region having a first conductivity type; and a second semiconductor region disposed at least partially within the first semiconductor region, the second semiconductor region having a second conductivity type, wherein the first semiconductor region separates the second semiconductor region from the substrate. In one embodiment, the substrate and the first semiconductor region have a sigma-shaped boundary. In another embodiment, the substrate and the first semiconductor region have U-shaped boundary. In a further embodiment, the first semiconductor region comprises an alloy of a first material and a second material, where the concentration of the second material varies from a maximum to a minimum, where the first semiconductor region adjacent to the second semiconductor region has the minimum of the concentration of the second material.

16 Claims, 8 Drawing Sheets

(56) References Cited

OTHER PUBLICATIONS

S. Song* and J. W. Blatchford, "Review Paper: Advanced Source and Drain Technologies for Low Power CMOS at 22/20 nm Node and Below", Electronic Materials Letters, V. 7, No. 4, pp. 277-285, 2011.
Tsu-Jae King, James P. McVittie, Krishna C. Saraswat, Fellow, IEEE, and James R. Pfiester, "Electrical Properties of Heavily Doped Polycrystalline Silicon-Germanium Films", IEEE Trans. Ed, V. 41, No. 2, p. 228, 1994.
D. V. Singh, J. L. Hoyt, and J. F. Gibbons, "Effect of Band Alignment and Density of States on the Collector Current in p-Si/n-S1 yCy/p-Si HBTs", IEEE Trans. Ed, V.50, No. 2, p. 425, 2003.
D. V. Singh, et.al., "Admittance spectroscopy analysis of the conduction band offsets in Si/Si1-x-yGexCy and Si/Si1-yCy heterostructures", J. Applied Phyisics, v.85,2, p. 985-993, 1999.

* cited by examiner

DIODES AND FABRICATION METHODS THEREOF

TECHNICAL FIELD

The present disclosure relates to semiconductor devices and methods of fabricating semiconductor devices, and more particularly to diodes and methods for fabricating diodes.

BACKGROUND

The semiconductor industry continues to pursue integrated circuits with improved performance and functionality, such as integrated circuits with reduced power consumption. One way to reduce power consumption of an integrated circuit is to reduce the operating voltage of the integrated circuit. In order to achieve a lower operating voltage of an integrated, numerous semiconductor device types, and not only transistors, that are required for the integrated circuit must each be designed to operate at lower voltages.

For instance, diodes, such as Zener diodes, are key required devices for integrated circuits. By way of example, Zener diodes can be used to provide a reference voltage when operating at break-down mode for radio-frequency circuits, analog or precision circuits, electrostatic discharge protection, and high-frequency functions such as gigahertz circuits. However, typically a silicon Zener diode operates at a (Zener) breakdown voltage in the range of 5 to 15 volts.

Therefore, a need exists for improved diodes and methods of fabricating Zener diodes having reduced Zener breakdown voltages for modern low voltage complementary metal oxide semiconductor (CMOS) technology nodes operating at voltages of 1 to 3 volts.

BRIEF SUMMARY

The shortcomings of the prior art are overcome, and additional advantages are provided, through the provision, in one aspect, of a diode. The diode includes: a first semiconductor region disposed at least partially within a substrate, the first semiconductor region having a first conductivity type; and a second semiconductor region disposed at least partially within the first semiconductor region, the second semiconductor region having a second conductivity type, wherein the first semiconductor region separates the second semiconductor region from the substrate.

In another aspect, a method for fabricating a diode is presented. The method includes: providing a cavity within a substrate; and forming a first semiconductor region at least partially within the cavity of the substrate and a second semiconductor region at least partially within the first semiconductor region, wherein the first semiconductor region has a first conductivity type and the second semiconductor region has a second conductivity type, and the first semiconductor region separates the second semiconductor region from the substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, diodes and methods for fabricating diodes, which are two terminal devices that asymmetrically conduct electricity. For example, a semiconductor diode includes a p-n junction for rectifying a current. A Zener diode is a diode with a highly doped p-n junction, which allows forward current flow like an ideal diode, but also allows large current to flow in the reverse direction when the voltage is above a breakdown voltage, referred to as the Zener breakdown voltage. The Zener breakdown occurs by band-to-band tunneling and is stable in temperature range and often used as a reference voltage on-chip.

Advantageously, the present techniques provide diodes, including Zener diodes that have a Zener breakdown voltage of less than 3 volts, and also provide fabrication methods that are compatible with advanced technology nodes, such as 14 nanometer technology. For example, in one embodiment, no extra photolithographic mask steps are needed to form the diodes, because process steps for forming source/drain regions of field-effect transistors can be used to form the diodes.

As another advantage, the present techniques provide for band-gap tuning so that the Zener breakdown voltage can be tuned to be compatible with a desired operating voltage of the integrated circuit. In addition, the present techniques allow for diodes having high doping concentrations using epitaxial growth methods with in situ doping techniques.

Further, the present techniques provide for diodes that are less sensitive to the doping levels of the p-n junction. In addition, the present techniques allow for diodes formed in various well regions, such as p-wells and n-wells.

Generally stated, provided herein, in one aspect, is a diode. The diode includes: a first semiconductor region disposed at least partially within a substrate, the first semiconductor region having a first conductivity type; and a second semiconductor region disposed at least partially within the first semiconductor region, the second semiconductor region having a second conductivity type, wherein the first semiconductor region separates the second semiconductor region from the substrate.

In one embodiment, the substrate and the first semiconductor region have a sigma-shaped boundary. In another embodiment, the substrate and the first semiconductor region have U-shaped boundary. In another embodiment, the first semiconductor region and the second semiconductor region have a sigma-shaped boundary. In a further embodiment, the first semiconductor region and the second semiconductor region have a U-shaped boundary.

In one embodiment, the first semiconductor region includes an alloy of a first material and a second material, where the concentration of the second material varies from a maximum to a minimum, where the first semiconductor region adjacent to the second semiconductor region has the minimum of the concentration of the second material.

In another embodiment, the second semiconductor region includes an alloy of a first material and a second material, where the concentration of the second material varies from a maximum to a minimum, where the second semiconductor region adjacent to the first semiconductor region has the minimum of the concentration of the second material.

In one embodiment, at least one of the first semiconductor region or the second semiconductor region includes layers of a semiconductor alloy, where some of the layers of the semiconductor alloy have different alloy concentrations. In another embodiment, at least one of the first semiconductor region or the second semiconductor region includes an epitaxial semiconductor region. In a further embodiment, a breakdown voltage of the diode is approximately less than or equal to 1.0 volts.

Reference is made below to the drawings, which are not drawn to scale for ease of understanding, wherein the same reference numbers used throughout different figures designate the same or similar components.

Figure 1:
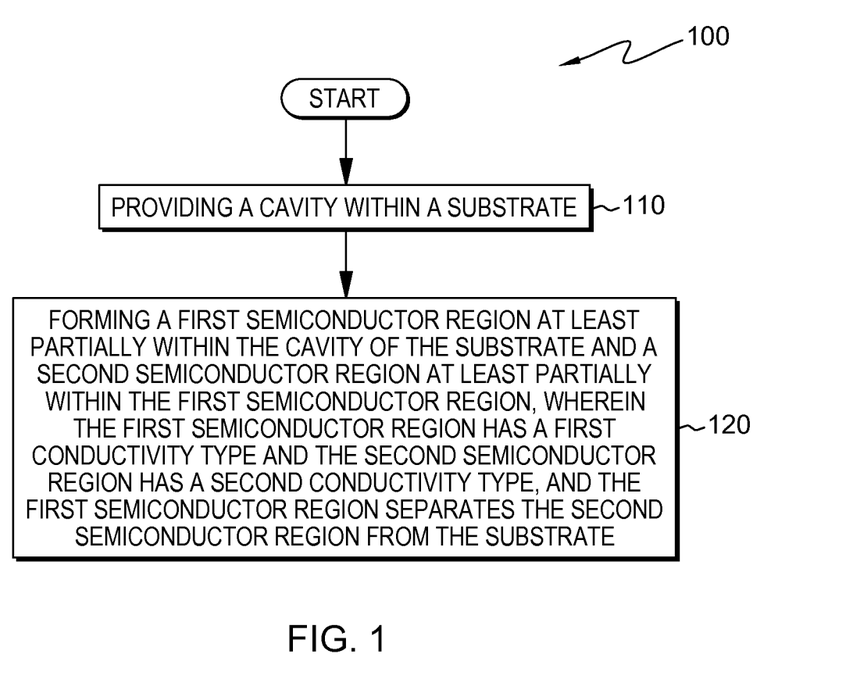
FIG. 1 depicts embodiments of processes for fabricating a diode, such as a Zener diode, in accordance with one or more aspects set forth herein.

FIG. 1 depicts embodiments of processes for fabricating a diode, in accordance with one or more aspects set forth herein.

In one embodiment, the method includes at block 110 providing a cavity within a substrate; and at block 120 forming a first semiconductor region at least partially within the cavity of the substrate and a second semiconductor region at least partially within the first semiconductor region, wherein the first semiconductor region has a first conductivity type and the second semiconductor region has a second conductivity type, and the first semiconductor region separates the second semiconductor region from the substrate.

In one embodiment, the method includes at block 110 providing the cavity with a sigma-shaped boundary. In another embodiment, the method includes at block 110 providing the cavity with a U-shaped boundary.

In one embodiment, the method includes at block 120 forming another cavity within the first semiconductor region and forming the second semiconductor region at least partially within the other cavity of the first semiconductor region. In such a case, in one example, the method includes at block 120 forming the other cavity with a sigma-shaped boundary. In another example, the method includes at block 120 forming the other cavity with a U-shaped boundary.

In one embodiment, the method includes at block 120 epitaxially forming at least one of the first semiconductor region and the second semiconductor region. In another example, the method includes at block 120 epitaxially forming the first semiconductor region as an alloy of a first material and a second material, and varying the concentration (or composition) of the second material from a maximum to a minimum during the forming, wherein the first semiconductor region adjacent to the second semiconductor region has the minimum of the concentration of the second material. For example, the concentration can be varied by varying the concentration of source gases introduced into an epitaxial growth chamber.

In one embodiment, the method includes at block 120 disposing layers of a semiconductor alloy to form the first semiconductor region, wherein some of the layers of the semiconductor alloy have different alloy concentrations. In another embodiment, the method includes fabricating the diode with a breakdown voltage of approximately less than or equal to 1.0 volts.

In particular, the above techniques allow for new structures and techniques to form diodes, such as Zener diodes, having tunable band-gaps for reducing the breakdown voltages of the diodes. By way of explanation, energy band levels in silicon (Si), germanium (Ge), silicon germanium ($Si_{1-x}Ge_x$), silicon germanium carbon ($Si_{1-x-y}Ge_xC_y$), and silicon carbon ($Si_{1-x}C_y$) may be compared. The bandgap of a material is defined by a valence band energy $E_C$ and a conduction band energy Ev, as $E_C$-$E_V$. Band gap engineering can be used to form structures, such as hetero-structures, having materials with multiple different bandgaps depending on the composition of material (i.e. Ge and C concentration in Si), such as the diodes described herein.

At a standard temperature of 300 K, the bandgap of silicon is 1.12 electron volts (eV), and the electron affinity of silicon, or the energy required to remove a conduction electron from silicon into vacuum, is 4.05 eV. At a standard temperature of 300 K, the bandgap of germanium is 0.66 electron volts (eV), and the electron affinity of germanium is 4.00 eV. In one embodiment, the Ge content in Si mainly shifts the valence band edge upward, resulting in narrower band-gap than pure Si.)

$Si_{1-x-y}Ge_xC_y$ may have a narrowed bandgap compared to silicon, because the valence band edge is shifted upward by 5-7 meV per atomic percentage of germanium (x times 7.5 meV), the conduction band edge is shifted downward by 30 meV per atomic percentage of carbon (y times 30 meV). Therefore, the Ge and C contents in Si mainly shift the valence band edge and conduction band edge respectively.

In the above examples, the narrowed bandgap may be attained by adjusting one or both of the valence band edge or the conduction band edge. For example, reducing the conduction band energy (by, for example, increase the C content), or increasing the valence band energy (by, for example, increase the Ge content) could both reduce the bandgap (in comparison to pure Si). In addition, two adjacent materials can each be adjusted to tune the bandgaps of both materials, and thus influence the electrical properties of a junction, such as a p-n junction, between the two materials.

For example, a diode of the present technique can include a first semiconductor region having p-type doped embedded silicon germanium and a second semiconductor region having n-type doped embedded silicon carbon, so that the bandgaps are tuned such that the band valence edge and conduction edge are shifted toward the middle of the bandgap, so that the Zener voltage can be tuned lower than 3 volts, because of the smaller bandgaps. In such a case, the diodes can be less sensitive to doping levels in the junction.

In addition, the diodes described herein can be formed during integrated circuit fabrication in such a way that no additional steps of photolithographic masking are needed. For example, epitaxial Si Ge or Si C can be formed during process steps for forming source/drain regions of transistors co-located on an integrated circuit with the diode. Further, a high doping level and high level of activation can be achieved by using in-situ doping during epitaxial formation of the diode.

Figure 2A:
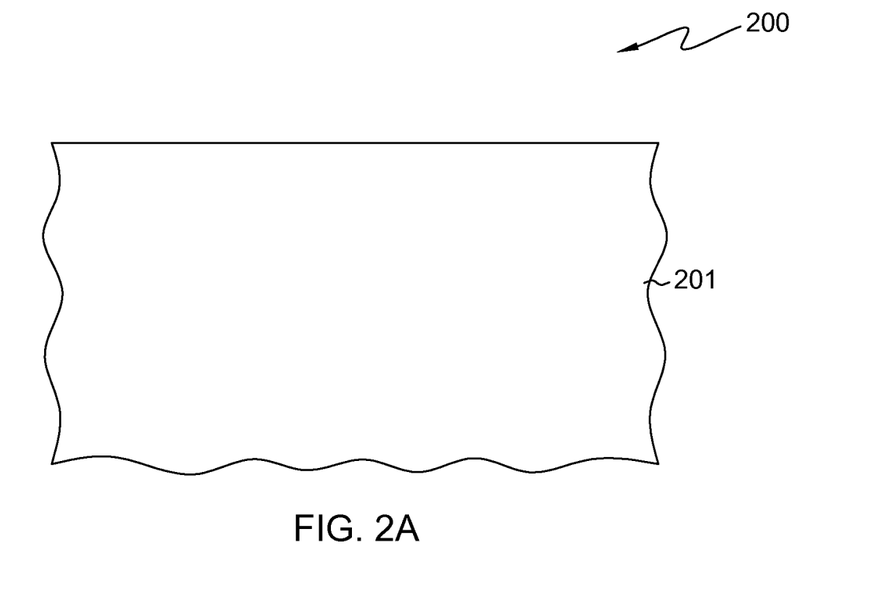
FIG. 2A depicts a structure found in a semiconductor fabrication process, in accordance with one or more aspects set forth herein.

FIG. 2A depicts an intermediate structure 200 found in a semiconductor fabrication process, in accordance with one or more aspects set forth herein.

In the embodiment of FIG. 2A, structure 200 includes a substrate 201. In one embodiment, substrate 201 can be a bulk semiconductor material such as a bulk silicon wafer. In another embodiment, substrate 201 can include silicon (Si), single crystal Si, polycrystalline Si, amorphous Si, Si-on-nothing (SON), Si-on-insulator (SOI), or Si-on-replacement insulator (SRI). In a further embodiment, substrate 201 can be n-type or p-type doped. In such a case, the entire substrate 201 may be doped, or various regions may be n-type and p-type doped to form various n-wells and p-wells. In one particular example, substrate 201 can have a thickness of less than or equal to 0.1 micrometers.

By way of explanation, structure 200 can be or include an integrated circuit. The fabrication processes described herein can be used to form numerous semiconductor devices, such as diodes, within structure 200. For example, various regions of structure 200 can include numerous semiconductor devices, such as transistors, and numerous diodes of the present disclosure. In one embodiment, thousands, millions, or billions of diodes can be fabricated within structure 200, including some or all of the embodiments described herein, as needed for a particular integrated circuit design. In such a case, the techniques disclosed herein may be used to fabricate numerous instances of multiple embodiments as required.

Figure 2B:
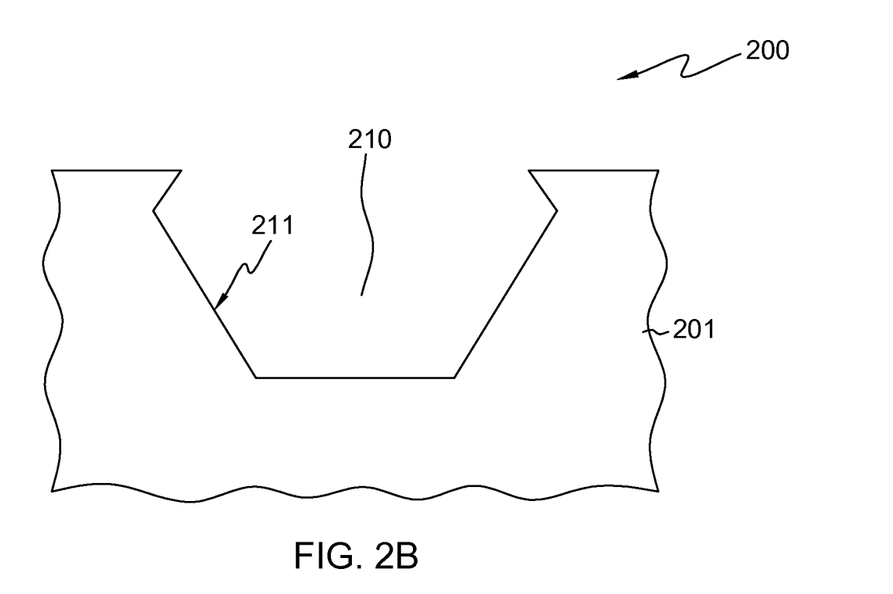
FIG. 2B depicts the structure of FIG. 2A after providing a cavity having a sigma-shaped boundary within a substrate thereof, in accordance with one or more aspects set forth herein.

FIG. 2B depicts structure 200 (for example having a (100) Si surface) after providing a cavity 210 having a sigma-shaped boundary 211 within substrate 201, in accordance with one or more aspects set forth herein.

In one embodiment, cavity 210 can be formed by masking portions of substrate 201 and etching portions to form cavity 210. For instance, anisotropic wet etching using, for example, potassium hydroxide (KOH) or tetra-methyl-ammonium hydroxide (TMAH) could be used to form cavity 210. After performing anisotropic etching, another step, or series of steps, of etching, including isotropic and anisotropic etching steps, including for example wet etching using TMAH, may be performed to further shape (with deeper depth) or clean cavity 210. For simplicity and ease of understanding, various hard masks of oxide or nitride are not shown, but may be present.

In the embodiment of FIG. 2B, cavity 210 has a sigma-shaped boundary 211. The terms sigma-shaped boundary or sigma-cavity are used because of the resemblance between the capital Greek-letter Σ (sigma) and the profile of angular planes in a sigma-shaped boundary or sigma-cavity, because both a sigma-shaped boundary or sigma cavity have (111) and (100) planes, as depicted in FIG. 2B. The symbol {xyz} denotes the Miller index for the set of equivalent crystal planes in a crystalline material, such as a crystalline semiconductor material. For instance, anisotropic wet etching using KOH or TMAH can etch (100) and (110) surface much faster the (111) surface, thus the (111) surface remains as the boundary planes and (100) is on the bottom of the sigma cavity. If given longer etch time, the cavity will be deeper with (100) portion disappearing and reduced to (111) surface.

Figure 2C:
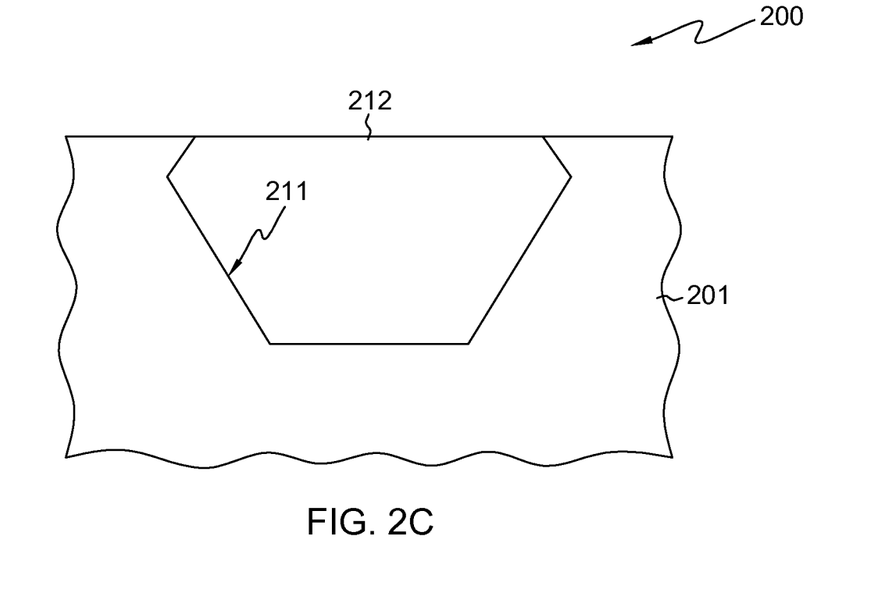
FIG. 2C depicts the structure of FIG. 2B after forming a first semiconductor region within the cavity of the substrate thereof, in accordance with one or more aspects set forth herein.

FIG. 2C depicts structure 200 after forming a first semiconductor region 212 within cavity 210 (FIG. 2B) of substrate 201, in accordance with one or more aspects set forth herein. In such a case, substrate 201 and first semiconductor region 212 have sigma shaped boundary 211.

In one embodiment, a semiconductor fabrication process includes epitaxially forming first semiconductor region 212. Epitaxial growth refers to the orderly growth of a crystalline material from a substrate, where the grown material arranges itself in the same crystal orientation as the underlying substrate. In one example, epitaxial growth occurs from either one or more surfaces of cavity 210 FIG. 2B, including, for example, a (111) plane, or a (100) plane. First semiconductor region 212 may be epitaxially grown using selective epitaxial growth via various methods, such as, for example, vapor-phase epitaxy (VPE), a modification of chemical vapor deposition (CVD), molecular-beam epitaxy (MBE), and/or liquid-phase epitaxy (LPE), or other applicable methods. The semiconductor region 212 can be planarized by CMP process (not illustrated here for simplicity). In one embodiment, substrate 201 can include an n-well or a p-well, and the diode can be fabricated within the well of substrate 201.

In one embodiment, first semiconductor region 212 is or includes an alloy of a first material and a second material, such as silicon and germanium, silicon and carbon, or silicon germanium and carbon. In another embodiment, during the epitaxial growth, the concentration of the second material is varied from a maximum to a minimum during the forming. In such a process, the first semiconductor region adjacent to the substrate can have the minimum of the concentration of the second material, in order to prevent defects from developing at sigma shaped boundary 211. In such a way, the benefits of the bandgap narrowing mentioned above may be obtained without the downside of defect formation when the materials vary at an interface. For example, epitaxial formation of silicon germanium, silicon germanium carbon, and silicon carbon, can be achieved on a silicon substrate, with a varying concentration of the non-silicon material allowing for smooth and defect free growth at the boundary.

In one embodiment, the concentration of the second material can be continuously varied by adjusting the flow of a source gas during the epitaxial formation process. In another embodiment, the forming can include disposing layers of a semiconductor alloy to form the first semiconductor region, where some of the layers of the semiconductor alloy have different alloy concentrations.

For instance, a first layer can have a small percentage of the second material, and each subsequent layer can have an increasing percentage of the second material, until a maximum concentration of the second material is reached. In addition, the percentage can be decreased, so that the concentration of the second material again reaches a minimum somewhere in the middle of first semiconductor region 212, so that a second semiconductor region may be formed therein, and can grow with minimal defects.

Figure 2D:
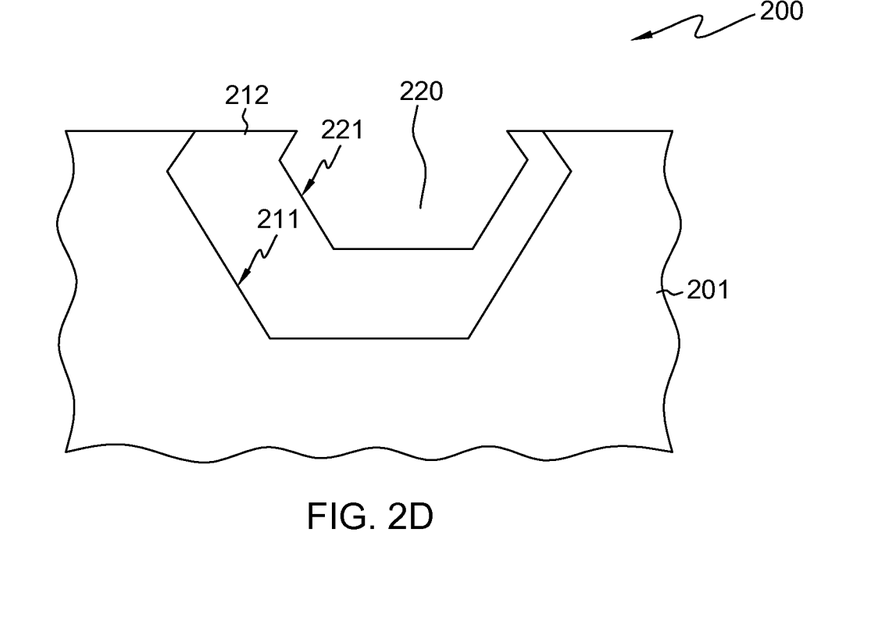
FIG. 2D depicts the structure of FIG. 2C after forming a cavity having a sigma-shaped boundary within the first semiconductor region thereof, in accordance with one or more aspects set forth herein.

FIG. 2D depicts structure 200 after forming a cavity 220 having a sigma-shaped boundary 221 within first semiconductor region 212, in accordance with one or more aspects set forth herein.

In one embodiment, growth of first semiconductor region can be tuned so that after formation of cavity 220, an upper exposed surface of first semiconductor region 212 has a minimum of the concentration of the second material.

Figure 2E:
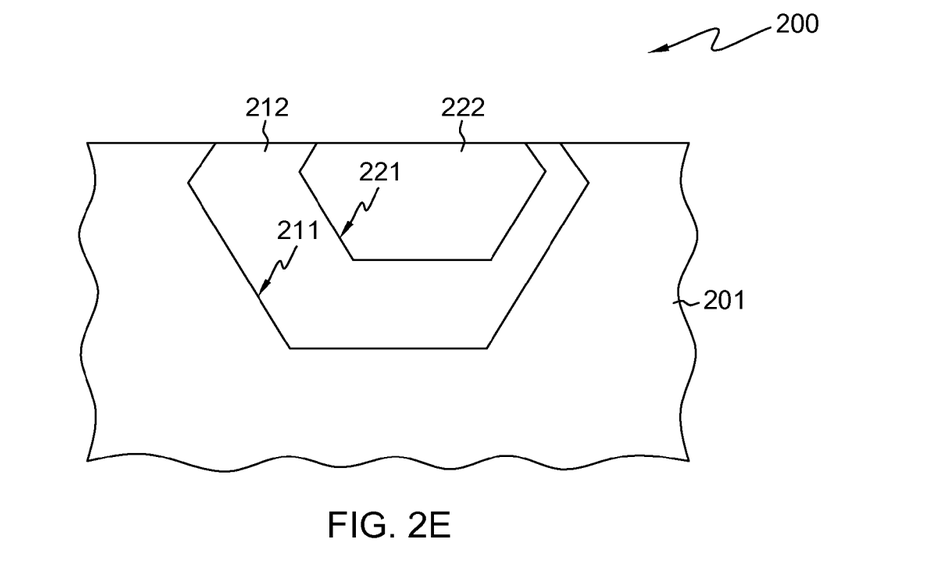
FIG. 2E depicts the structure of FIG. 2D after forming a second semiconductor region at least partially within the cavity of the first semiconductor region, in accordance with one or more aspects set forth herein.

FIG. 2E depicts structure 200 after forming a second semiconductor region 222 at least partially within cavity 220 (FIG. 2D) of first semiconductor region 212, in accordance with one or more aspects set forth herein. In one embodiment, second semiconductor region 222 is formed such that portions close to sigma shaped boundary 221 have a low concentration of the second material, to prevent formation of defects that could impact electrical properties of the p-n junction and the diode.

In the embodiment of FIG. 2E, first semiconductor region 212 and second semiconductor region 222 share sigma-shaped boundary 221. In one example, the diode may be tuned so that its breakdown voltage is approximately less than or equal to 1.0 volts. The sharp breakdown voltage of the diode can be achieved by adjusting the bandgaps of first semiconductor region 212 and second semiconductor region 222.

For example, first semiconductor region 212 can include silicon germanium that is in situ doped with a relatively high concentration of boron and second semiconductor region 222 can include silicon carbon that is in situ doped with a relatively high concentration of phosphorous. In such a case, because of the bandgap engineering of the diode, the diode can have a breakdown voltage less than 1 volt and less sensitive to the dopant concentration, facilitating highly doped semiconductor regions 212, 222.

In one example, diodes, such as Zener diodes, detailed herein may be fabricated within an integrated circuit that includes planar filed effect transistors (FETs), or three dimensional FETs in which fin structures extend from the substrate and include channels of three dimensional FETs known as fin FETs.

In one example, substrate 201 can include a p-well in which the diode is formed, and the diode can have an anode that includes a p+-type first semiconductor region 212 and a cathode that includes an n+-type second semiconductor region 222.

In another example, substrate 201 can include an n-well in which the diode is formed, and the diode can have a cathode that includes an n+-type first semiconductor region 212 and an anode that includes a p+-type second semiconductor region 222.

In one embodiment, n-type semiconductor regions may include epitaxially formed SiC, SiCP, or SiP. In another embodiment, p-type semiconductor regions may include epitaxially formed silicon germanium (as consistent with the junction polarity in advanced CMOS technology).

By way of explanation, in addition to the embodiments described above, other embodiments may be formed using the same or similar techniques, and will be described below. In an integrated circuit hundreds, thousands, millions, or more of each embodiment may be fabricated in a single integrated circuit depending upon the functionality desired.

Figure 3A:
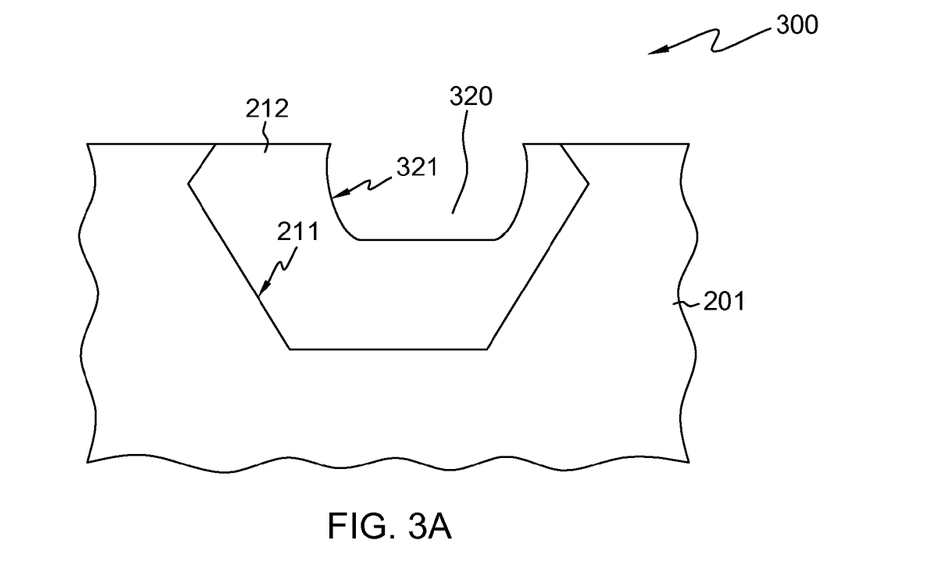
FIG. 3A depicts the structure of FIG. 2B after forming a cavity having a U-shaped boundary within the first semiconductor region thereof, in accordance with one or more aspects set forth herein.
Figure 3B:
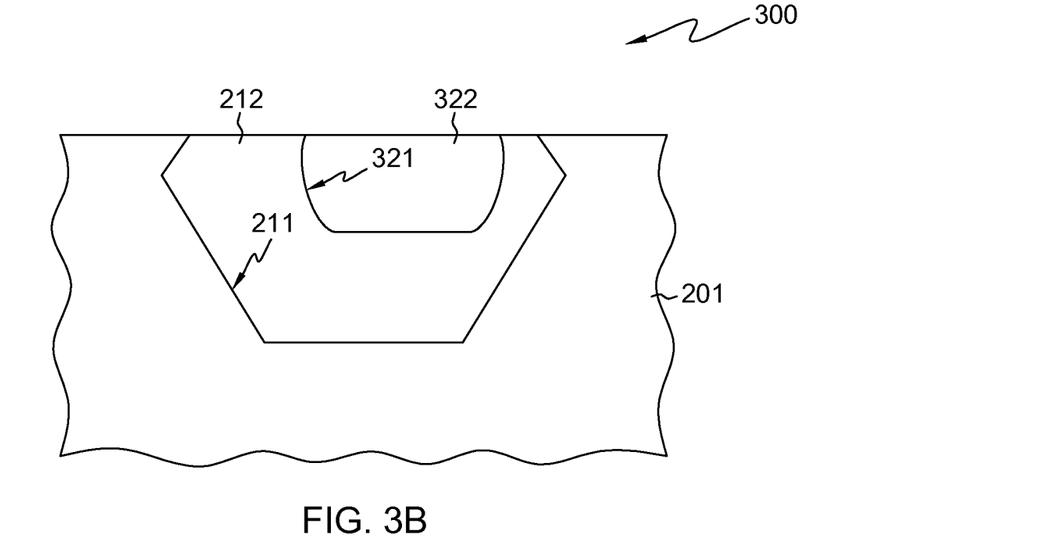
FIG. 3B depicts the structure of FIG. 3A after forming a second semiconductor region at least partially within the cavity of the first semiconductor region, in accordance with one or more aspects set forth herein.

In another aspect, FIGS. 3A-3B depict fabrication processes starting with the structure of FIG. 2C, in accordance with one or more aspects set forth herein.

FIG. 3A depicts structure 300 after forming a cavity 320 having a U-shaped boundary 321 within first semiconductor region 212, in accordance with one or more aspects set forth herein. A U-shaped boundary may be formed using, for example, one or more steps of etching, such as isotropic etching.

FIG. 3B depicts structure 300 after forming a second semiconductor region 322 at least partially within cavity 320 (FIG. 3A) of first semiconductor region 212, in accordance with one or more aspects set forth herein. In the illustrated embodiment, first semiconductor region 212 and second semiconductor region 322 share U-shaped boundary 321.

In another aspect, FIGS. 4A-4D depict fabrication processes starting with the structure of FIG. 2A, in accordance with one or more aspects set forth herein.

Figure 4A:
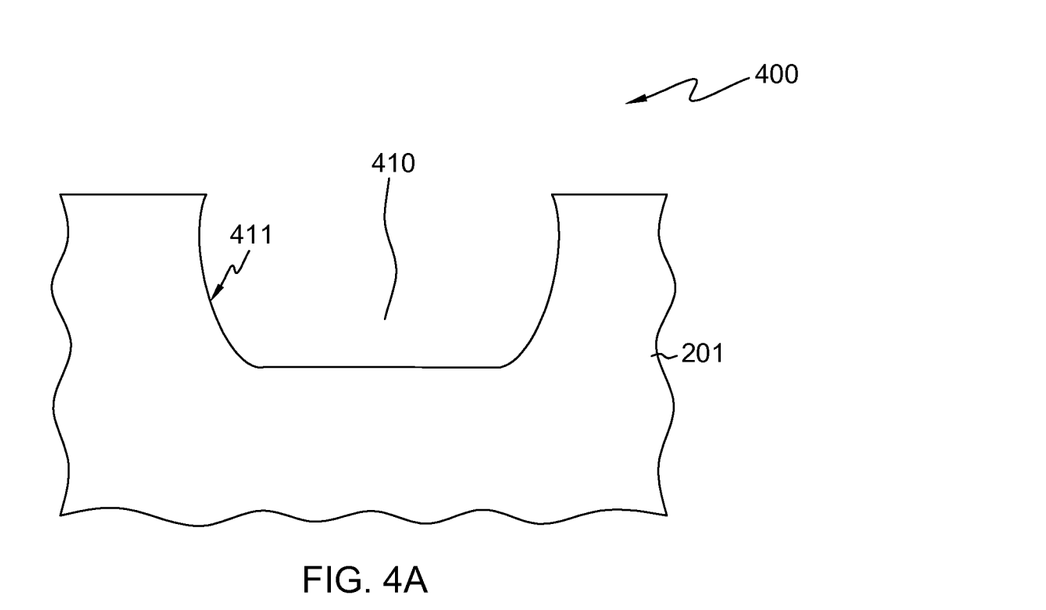
FIG. 4A depicts the structure of FIG. 2A after providing a cavity having a U-shaped boundary within a substrate thereof, in accordance with one or more aspects set forth herein.

FIG. 4A depicts structure 400 after providing a cavity 410 having a U-shaped boundary 411 within substrate 201, in accordance with one or more aspects set forth herein.

Figure 4B:
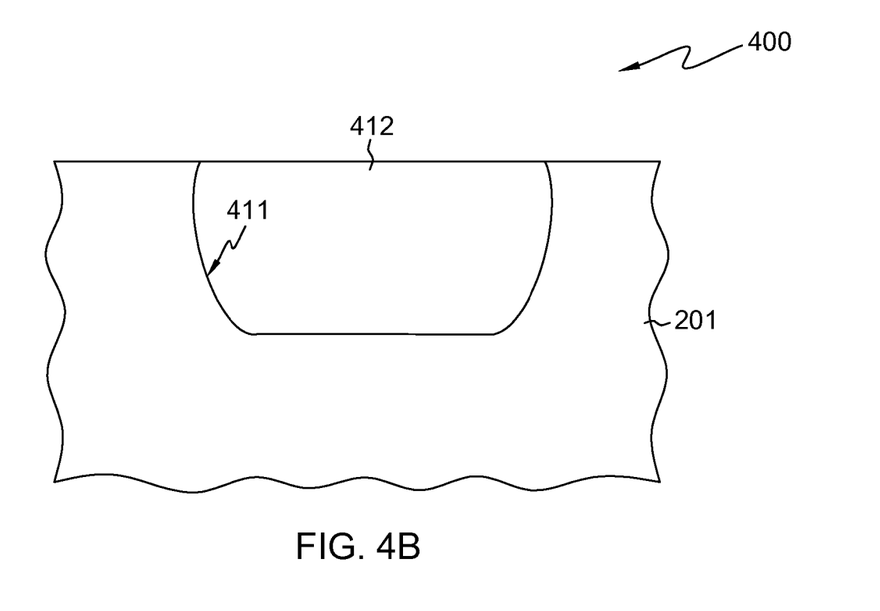
FIG. 4B depicts the structure of FIG. 4A after forming a first semiconductor region within the cavity of the substrate thereof, in accordance with one or more aspects set forth herein.

FIG. 4B depicts structure 400 after forming a first semiconductor region 412 within cavity 410 (FIG. 4A) of substrate 201, in accordance with one or more aspects set forth herein. In the embodiment of FIG. 4B, substrate 201 and first semiconductor region 412 have a U-shaped boundary 411.

Figure 4C:
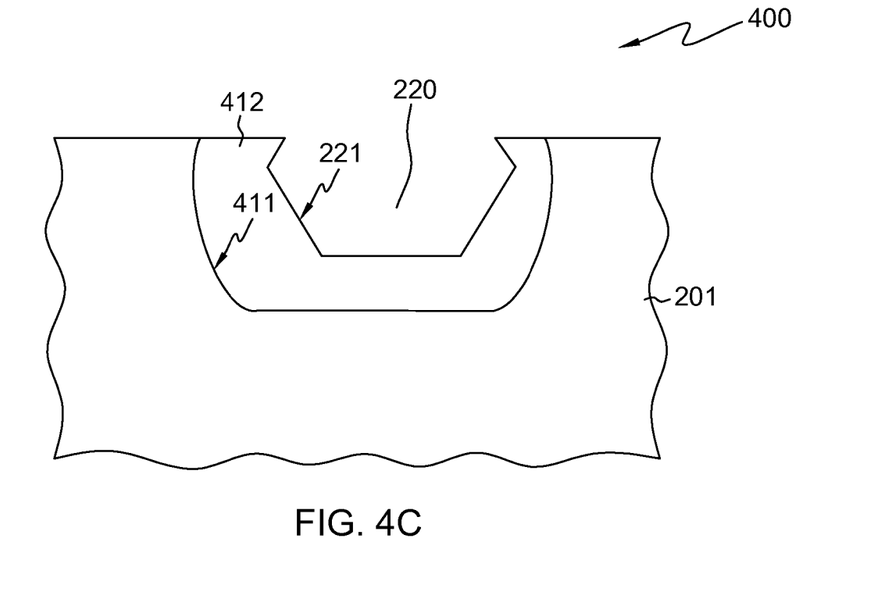
FIG. 4C depicts the structure of FIG. 4B after forming a cavity having a sigma-shaped boundary within the first semiconductor region thereof, in accordance with one or more aspects set forth herein.

FIG. 4C depicts structure 400 after forming a cavity 220 having a sigma-shaped boundary 221 within first semiconductor region 412, in accordance with one or more aspects set forth herein.

Figure 4D:
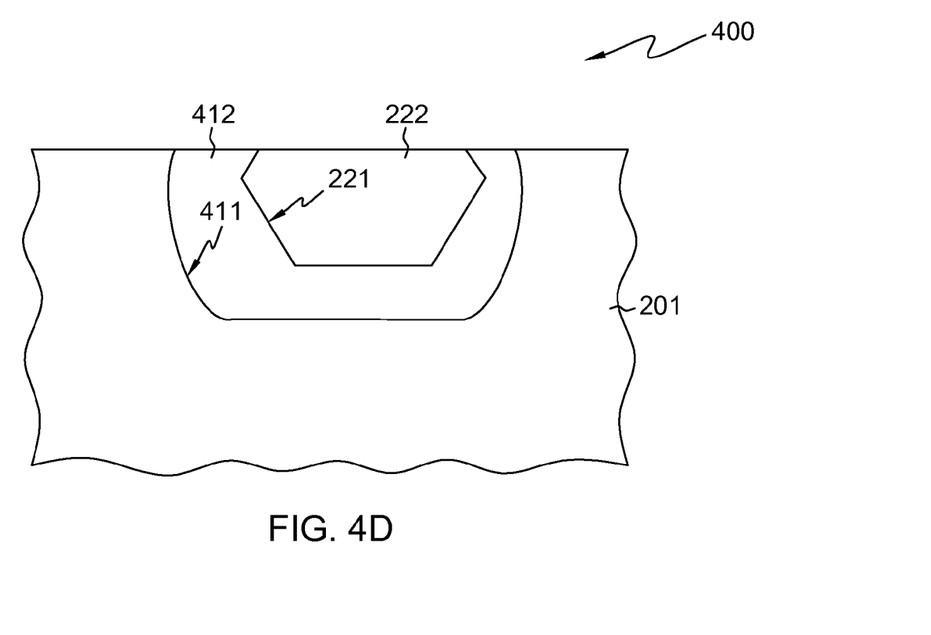
FIG. 4D depicts the structure of FIG. 4C after forming a second semiconductor region at least partially within the cavity of the first semiconductor region, in accordance with one or more aspects set forth herein.

FIG. 4D depicts structure 400 after forming a second semiconductor region 222 at least partially within cavity 220 (FIG. 4C) of first semiconductor region 412, in accordance with one or more aspects set forth herein.

Figure 5A:
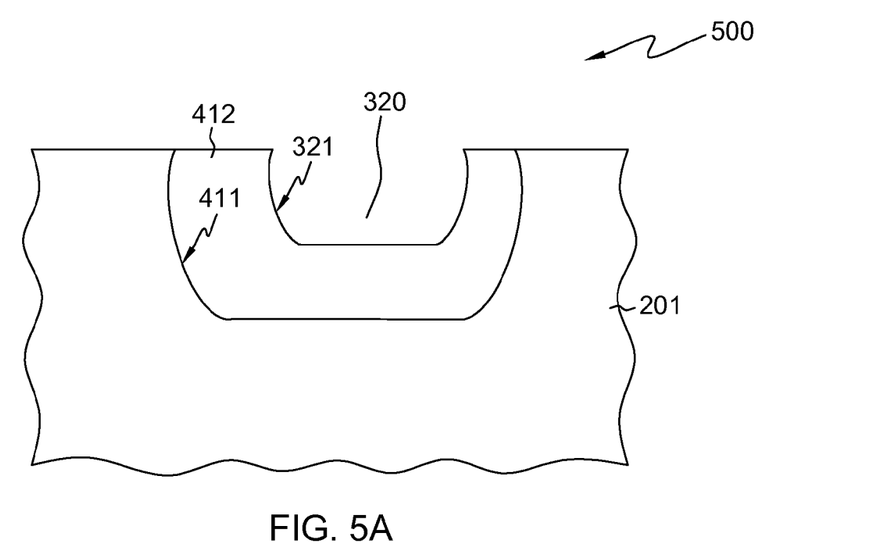
FIG. 5A depicts the structure of FIG. 4A after providing a cavity having a U-shaped boundary within the first semiconductor region thereof, in accordance with one or more aspects set forth herein.
Figure 5B:
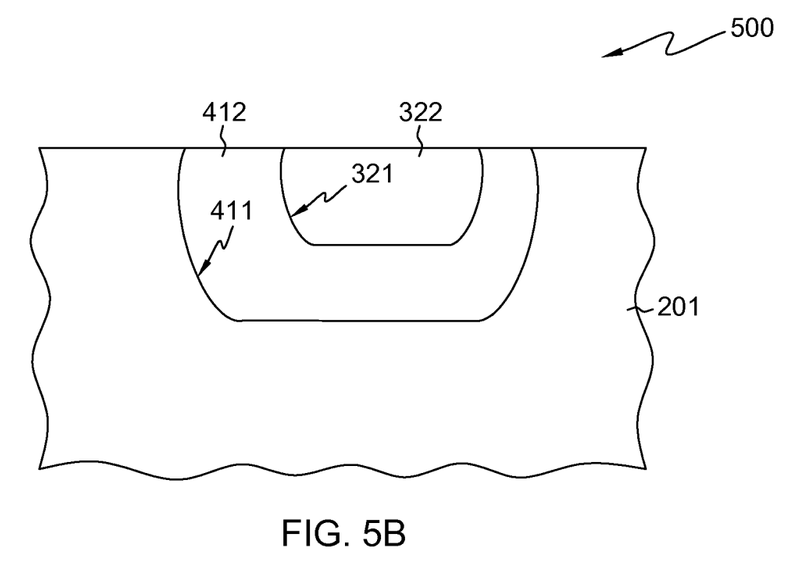
FIG. 5B depicts the structure of FIG. 5A after forming a second semiconductor region at least partially within the cavity of the first semiconductor region, in accordance with one or more aspects set forth herein.

In another aspect, FIGS. 5A-5B depict fabrication processes starting with the structure of FIG. 4A, in accordance with one or more aspects set forth herein.

FIG. 5A depicts structure 500 after providing a cavity 320 having a U-shaped boundary 321 within first semiconductor region 412, in accordance with one or more aspects set forth herein.

FIG. 5B depicts structure 500 after forming a second semiconductor region 322 at least partially within cavity 320 (FIG. 5A) of first semiconductor region 412, in accordance with one or more aspects set forth herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed is:

1. A diode comprising:
a first semiconductor region disposed at least partially within a substrate, the first semiconductor region having a first conductivity type, wherein the substrate and the first semiconductor region have a sigma-shaped boundary therebetween, and wherein the first semiconductor region comprises an alloy of a first material and a second material, wherein a concentration of the second material varies from a maximum to a minimum, wherein the first semiconductor region adjacent to the second semiconductor region has the minimum of the concentration of the second material; and
a second semiconductor region disposed at least partially within the first semiconductor region, the second semiconductor region having a second conductivity type, wherein the first semiconductor region separates the second semiconductor region from the substrate.

2. The diode of claim 1, wherein the substrate and the first semiconductor region have U-shaped boundary.

3. The diode of claim 1, wherein the first semiconductor region and the second semiconductor region have a sigma-shaped boundary.

4. The diode of claim 1, wherein the first semiconductor region and the second semiconductor region have a U-shaped boundary.

5. The diode of claim 1, wherein the second semiconductor region comprises an alloy of a first material and a second material, wherein a concentration of the second material varies from a maximum to a minimum, wherein the second semiconductor region adjacent to the first semiconductor region has the minimum of the concentration of the second material.

6. The diode of claim 1, wherein at least one of the first semiconductor region or the second semiconductor region comprises layers of a semiconductor alloy, wherein some of the layers of the semiconductor alloy have different alloy concentrations.

7. The diode of claim 1, wherein at least one of the first semiconductor region or the second semiconductor region comprises an epitaxial semiconductor region.

8. The diode of claim 1, wherein a breakdown voltage of the diode is approximately less than or equal to 1.0 volts.

9. A method comprising fabricating a diode, the fabricating comprising:
providing a cavity within a substrate, the cavity having a sigma-shaped boundary; and
forming a first semiconductor region epitaxially at least partially within the cavity of the substrate, wherein the sigma-shaped boundary is between the first semiconductor region and the substrate, and a second semiconductor region at least partially within the first semiconductor region, wherein the first semiconductor region has a first conductivity type and the second semiconductor region has a second conductivity type, and the first semiconductor region separates the second semiconductor region from the substrate, and wherein the first semiconductor region comprises an alloy of a first material and a second material, wherein a concentration of the second material varies from a maximum to a minimum, wherein the first semiconductor region adjacent to the second semiconductor region has the minimum of the concentration of the second material.

10. The method of claim 9, wherein the providing comprises providing the cavity with a U-shaped boundary.

11. The method of claim 9, wherein the forming comprises:
forming another cavity within the first semiconductor region and forming the second semiconductor region at least partially within the other cavity of the first semiconductor region.

12. The method of claim 11, wherein the forming comprises forming the other cavity with a sigma-shaped boundary.

13. The method of claim 11, wherein the forming comprises forming the other cavity with a U-shaped boundary.

14. The method of claim 9, wherein the forming comprises epitaxially forming at least one of the first semiconductor region and the second semiconductor region.

15. The method of claim 9, wherein the forming comprises disposing layers of a semiconductor alloy to form the first semiconductor region, wherein some of the layers of the semiconductor alloy have different alloy concentrations.

16. The method of claim 9, wherein the fabricating comprises fabricating the diode with a breakdown voltage of approximately less than or equal to 1.0 volts.

* * * * *